(12) United States Patent
Takei

(10) Patent No.: US 11,598,835 B2
(45) Date of Patent: Mar. 7, 2023

(54) MAGNETIC RESONANCE IMAGING APPARATUS, AND PROGRAM

(71) Applicant: GE Precision Healthcare LLC, Wauwatosa, WI (US)

(72) Inventor: Naoyuki Takei, Tokyo (JP)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 17/676,704

(22) Filed: Feb. 21, 2022

(65) Prior Publication Data

US 2022/0283255 A1 Sep. 8, 2022

(30) Foreign Application Priority Data

Mar. 5, 2021 (JP) .............................. JP2021-035868

(51) Int. Cl.
*G01R 33/56* (2006.01)
*G01R 33/561* (2006.01)
*G01R 33/54* (2006.01)

(52) U.S. Cl.
CPC ....... *G01R 33/5602* (2013.01); *G01R 33/543* (2013.01); *G01R 33/5608* (2013.01); *G01R 33/5617* (2013.01)

(58) Field of Classification Search
CPC .............. G01R 33/5602; G01R 33/543; G01R 33/5608; G01R 33/5617; G01R 33/5607; G01R 33/561
See application file for complete search history.

(56) References Cited

U.S. PATENT DOCUMENTS

| 4,896,113 | A | | 1/1990 | Pelc |
| 5,345,176 | A | * | 9/1994 | LeRoux ............... G01R 33/561 |
| | | | | 324/309 |
| 10,288,703 | B2 | | 5/2019 | Li |
| 2019/0369185 | A1 | | 12/2019 | Setsompop |

OTHER PUBLICATIONS

JP application 2021-035868 filed Mar. 5, 2021—Office Action dated Apr. 13, 2022, Machine Translation, 5 pages.
UC Wieshmann, et al., "Magnetic resonance imaging in epilepsy with a fast FLAIR sequence", Journal of Neurology, Neurosurgery, and Psychiatry 1996;61 : pp. 357-361.
Lee et al., "Rapid hybrid encoding for high-resolution whole-brain fluid-attenuated imaging," NMR Biomed. Dec. 2013; 26(12):1751-61, 11 pages.
Takeo et al., "FASCINATE: a pulse sequence for simultaneous acquisition of T2-weighted and fluid-attenuated images," Magn Reson Med. Jan. 2004; 51(1):205-11, 7 pages.

* cited by examiner

*Primary Examiner* — Susan S Lee

(57) ABSTRACT

To provide a technique with which a FLAIR image and a T1-weighted image can be acquired in a short scan time, a magnetic resonance imaging apparatus comprises: an RF driver unit 121 for driving an RF coil unit 103; a gradient coil driver unit 122 for driving a gradient coil unit 102; and a controller unit 124 connected to the RF coil driver unit 121 and gradient coil driver unit 122, for controlling them so that an imaging sequence ISc having a duration of 1TR for generating echoes from a body part being imaged is repetitively executed, where the imaging sequence ISc has a first sequence part SQ1 including an inversion pulse 11 and an FSE sequence 12, and a second sequence part SQ2 including an inversion pulse 21 and a GRE sequence 22.

15 Claims, 14 Drawing Sheets

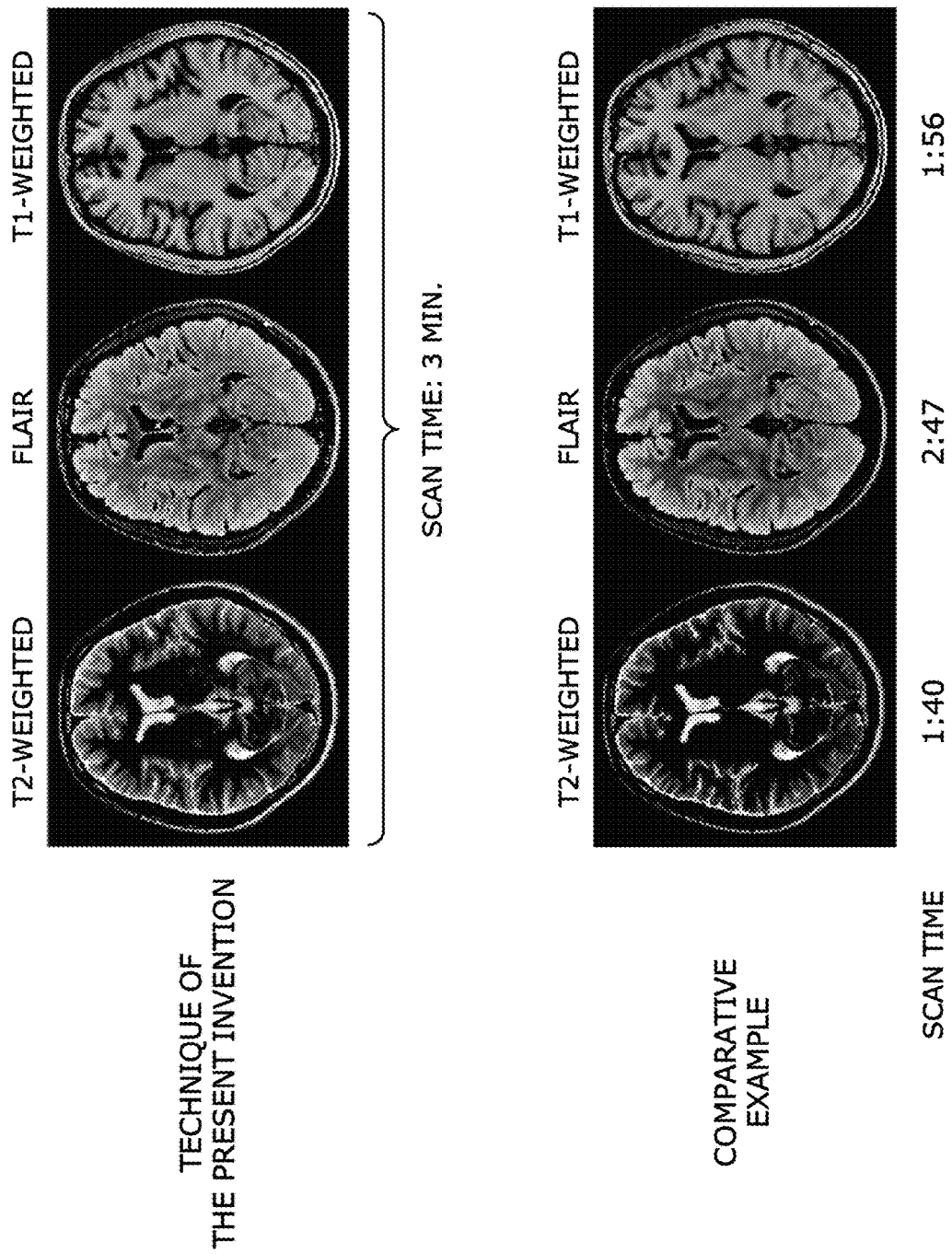

MAGNETIC RESONANCE IMAGING APPARATUS, AND PROGRAM

CROSS REFERENCE

The present application claims priority and benefit of Japanese Patent Application No. 2021-035868 filed on Mar. 5, 2021, which in incorporated herein by reference in its entirety.

FIELD OF THE INVENTION

The present invention relates to a magnetic resonance imaging apparatus for acquiring a Fluid attenuated inversion recovery (FLAIR) image and a T1-weighted image, and a program for causing a processor in the magnetic resonance imaging apparatus to execute predefined operations.

BACKGROUND OF THE INVENTION

One known medical apparatus for non-invasively capturing images of the inside of a body of a patient is an MRI (Magnetic Resonance Imaging) apparatus. The MRI apparatus applies a magnetic field to the patient, instead of irradiating the patient with X-rays, to collect image data. Since the MRI apparatus is thus able to collect image data without patient exposure to radiation, it is widely used in medical facilities, such as hospitals, as a medical apparatus providing a high level of safety.

Recently, a large number of imaging methods capable of providing MR images effective for patient diagnosis have been developed. For example, the large number of imaging methods that have been developed include: a method capable of enhancing a lesion, a method for reducing intensity of signals from tissues unnecessary for diagnosis, a method suitable for acquiring images in different temporal phases, etc.; such imaging methods are highly beneficial in enhancing diagnostic accuracy. By scanning a patient with different imaging methods, various MR images beneficial to the patient's diagnosis can be acquired, so that the scan of a patient with different imaging methods is adopted in performing an examination on the patient.

For example, in examining a head of a patient, imaging for acquiring MR images of multiple kinds including a FLAIR image, a T1-weighted image, etc. is often performed. A physician forms a patient's diagnosis referring to the MR images. The FLAIR image is capable of enhancing contrast between white matter and gray matter in the head while the T1-weighted image provides better visualization of the shape of a brain, both of which are beneficial to diagnosis. Therefore, in performing an MR examination on the patient's head, a scan for acquiring a FLAIR image and that for acquiring a T1-weighted image are often performed. Japanese Patent Application KOKAI No. 2017-051483 discloses an example of acquiring a FLAIR image and/or a T1-weighted image.

In examining a patient, however, an attempt to perform a scan for acquiring a FLAIR image as well as a scan for acquiring a T1-weighted image in a single examination session for the purpose of obtaining multiple MR images beneficial to diagnosis poses a problem that the scan time is lengthened.

Therefore, there is a need for a technique with which a FLAIR image and a T1-weighted image can be acquired in a short scan time.

BRIEF DESCRIPTION OF THE INVENTION

This summary introduces concepts that are described in more detail in the detailed description. It should not be used to identify essential features of the claimed subject matter, nor to limit the scope of the claimed subject matter.

The present invention, in its first aspect, is a magnetic resonance imaging apparatus comprising:
 a first driver unit for driving an RF coil unit
 a second driver unit for driving a gradient coil unit; and
 a controller unit for controlling said first driver unit and said second driver unit so that an imaging sequence having a duration of 1TR and being for generating echoes from a body part being imaged is repetitively executed, wherein
 said imaging sequence has a first sequence part for obtaining a FLAIR image, and a second sequence part executed after said first sequence part and being for obtaining a T1-weighted image, said first sequence part including:
  (1a) an $\alpha°$ pulse applied to said body part being imaged; and
  (1b) a spin-echo sequence for, after said $\alpha°$ pulse has been applied to said body part being imaged, generating spin echoes from said body part being imaged, for obtaining a FLAIR image, and said second sequence part including:
  (2a) a $\beta°$ pulse applied to said body part being imaged; and
  (2b) a gradient-echo sequence for, after said $\beta°$ pulse has been applied to said body part being imaged, generating gradient echoes from said body part being imaged, for obtaining a T1-weighted image.

The present invention, in its second aspect is a program for causing one or more processors to generate control signals for controlling a first driver unit for driving an RF coil unit and controlling a second driver unit for driving a gradient coil unit so that a first sequence part for obtaining a FLAIR image and a second sequence part executed after said first sequence part has been executed and being for obtaining a T1-weighted image are executed during 1TR, said first sequence part including:
 (1a) an $\alpha°$ pulse applied to a body part being imaged; and
 (1b) a spin-echo sequence for, after said $\alpha°$ pulse has been applied to said body part being imaged, generating spin echoes from said body part being imaged, for obtaining a FLAIR image, and said second sequence part including:
 (2a) a $\beta°$ pulse applied to said body part being imaged; and
 (2b) a gradient-echo sequence for, after said $\beta°$ pulse has been applied to said body part being imaged, generating gradient echoes from said body part being imaged, for obtaining a T1-weighted image.

The present invention, in its third aspect, is one or more non-transitory computer-readable recording media in which one or more instructions executable by one or more processors are stored, said one or more instructions cause said one or more processors to perform an operation of controlling a first driver unit for driving an RF coil unit and controlling a second driver unit for driving a gradient coil unit so that a first sequence part for obtaining a FLAIR image and a second sequence part executed after said first sequence part has been executed and being for obtaining a T1-weighted image are executed during 1TR, said first sequence part including:
 (1a) an $\alpha°$ pulse applied to a body part being imaged; and
 (1b) a spin-echo sequence for, after said $\alpha°$ pulse has been applied to said body part being imaged, generating spin echoes from said body part being imaged, for obtaining a FLAIR image, and said second sequence part including:

(2a) a β° pulse applied to said body part being imaged; and (2b) a gradient-echo sequence for, after said β° pulse has been applied to said body part being imaged, generating gradient echoes from said body part being imaged, for obtaining a T1-weighted image.

A FLAIR image is beneficial to patient diagnosis because signals from a fluid portion such as CSF (cerebrospinal fluid) can be suppressed therein and moreover can be given wide T2 contrast among a plurality of tissues of interest. The sequence for the FLAIR image, however, needs a longer TR so as to be unaffected by a T1 value as much as possible, and as a result, the scan time for acquiring the FLAIR image is lengthened.

The inventor of the present application focused on the fact that a long wait time is needed in the scan for a FLAIR image, and came up with the idea of taking advantage of the wait time in the sequence for a FLAIR image as an execution time of the sequence for acquiring a T1-weighted image, which is frequently used in diagnosis.

According to the present invention, during 1TR, a sequence part for collecting spin echoes for a FLAIR image is executed, and in addition, a sequence part for collecting gradient echoes for a T1-weighted image is executed. Thus, data for both the FLAIR image and T1-weighted image can be collected during a scan time for acquiring the FLAIR image, which makes it possible to reduce a scan time needed to acquire MR images of multiple kinds.

BRIEF DESCRIPTION OF THE DRAWINGS

FIG. 14 is a diagram showing an example of images actually acquired by the technique of the present embodiment.

DETAILED DESCRIPTION

Now several embodiments for practicing the invention will be described hereinbelow, although the present invention is not limited thereto.

Figure 1:
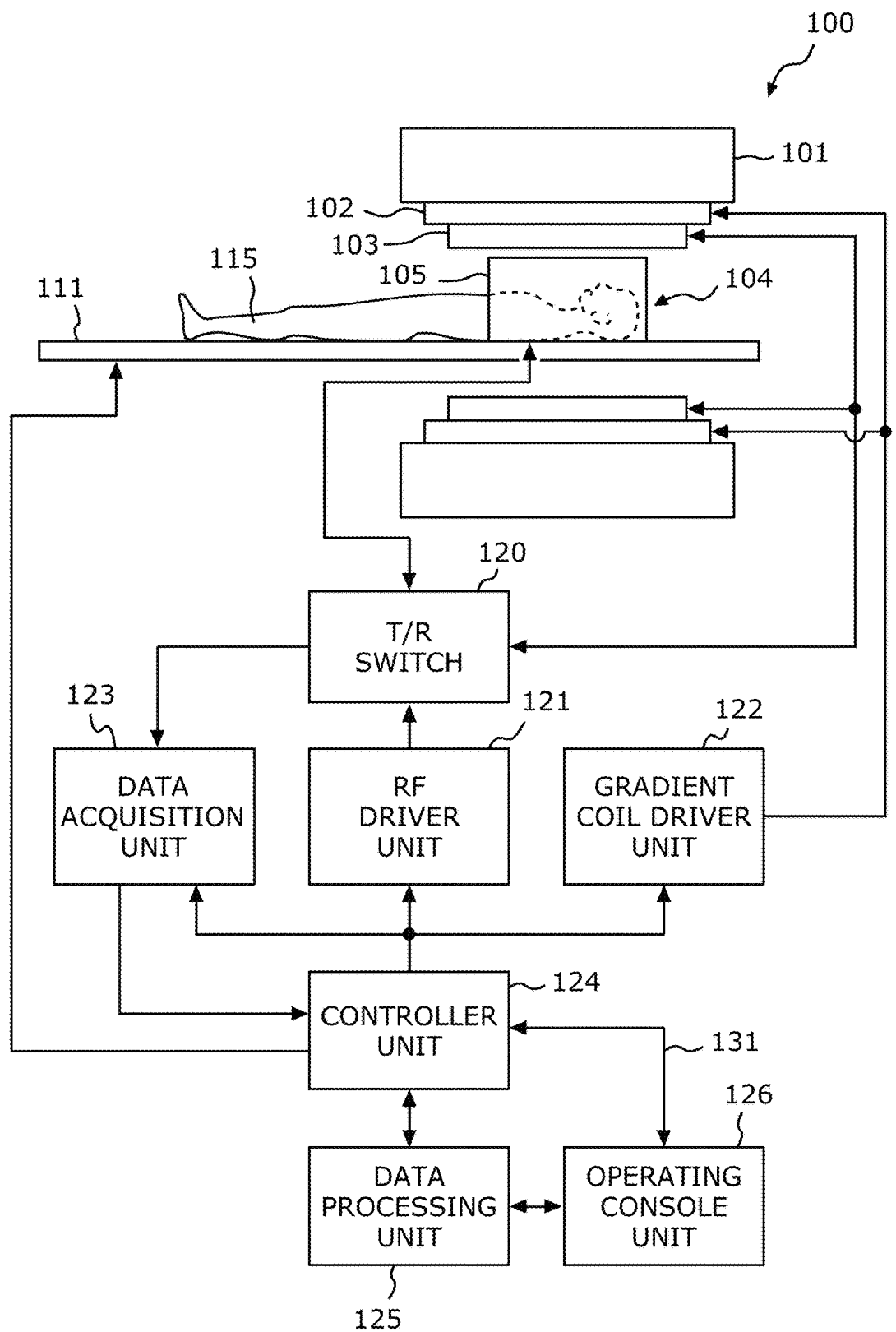
FIG. 1 is a diagram showing an MRI apparatus in one embodiment of the present invention.

FIG. 1 is a diagram showing an MRI apparatus in one embodiment of the present invention.

The MRI apparatus has a magnet 100.

The magnet 100 has a superconductive coil unit 101, a gradient coil unit 102, and an RF coil unit 103. The magnet 100 also has an interior wall defining a bore 104 through which an object to be imaged can be moved.

The superconductive coil unit 101 applies a static magnetic field in the inside of the bore 104. The gradient coil unit 102 has an x-axis coil, a y-axis coil, and a z-axis coil corresponding to three mutually orthogonal spatial axes (x-axis, y-axis, and z-axis), and applies a gradient field in the inside of the bore 104. The RF coil unit 103 applies an RF pulse in the inside of the bore 104.

A surface coil 105 is disposed around a body part to be imaged in the object 115 being imaged. The surface coil 105 receives an MR signal from the object 115 being imaged.

The MRI apparatus also has a T/R switch 120, an RF driver unit 121, a gradient coil driver unit 122, a data acquisition unit 123, a controller unit 124, a data processing unit 125, and an operating console unit 126.

The T/R switch 120 can connect the RF driver unit 121 to the RF coil unit 103 in a transmit mode, and connect the surface coil 105 to the data acquisition unit 123 in a receive mode.

The RF driver unit 121 is connected to the controller unit 124, and based on a control signal from the controller unit 124, outputs a drive signal for driving the RF coil unit 103. The RF coil unit 103 transmits an RF pulse in response to the drive signal from the RF driver unit 121. Additionally, the RF coil unit 103 may be dually used for transmission and reception to transmit the RF pulse and moreover receive the MR signal.

The gradient coil driver unit 122 is connected to the controller unit 124, and based on a control signal from the controller unit 124, outputs a drive signal for driving the gradient coil unit 102. The gradient coil unit 102 generates a gradient field in response to the drive signal from the gradient coil driver unit 122. The gradient coil driver unit 122 comprises three-channel drive circuitry (not shown) corresponding to the three gradient coils (x-axis coil, y-axis coil, and z-axis coil) included in the gradient coil unit 102.

The data acquisition unit 123 comprises a preamplifier (not shown), a phase detector (not shown), and an analog-to-digital (A/D) converter (not shown). The surface coil 105 outputs an analog signal corresponding to the received MR signal, and the analog signal is supplied to the preamplifier in the data acquisition unit 123 via the T/R switch 120. The analog signal is amplified at the preamplifier, the amplified analog signal is phase-detected at the phase detector, and the phase-detected analog signal is converted into a digital signal at the A/D converter. The thus-obtained digital signal is output to the data processing unit 125 by the controller unit 124.

The MRI apparatus also has a table 111. By moving the table 111 based on a control signal from the controller unit 124, the object 115 to be imaged can be moved into the bore 104.

The controller unit 124 comprises a computer, and a recording medium recorded with programs executed by the computer. The programs cause the computer to perform various operations required in performing an examination on the object being imaged. The recording medium may comprise, for example, ROM, a flexible disk, a hard disk, an optical disk, a magneto-optical disk, a CD-ROM, non-volatile memory, etc. The controller unit 124 outputs control signals for controlling the table 111, RF driver unit 121, gradient coil driver unit 122, and data acquisition unit 123. The controller unit 124 also controls the data processing unit 125 to acquire a desired image based on an operation signal received from the operating console unit 126.

The operating console unit 126 has an input device and a display device. The input device may comprise, for example, a mouse, a joystick, a keyboard, a trackball, a touch-operated screen, a light pen, and other input devices. The display device displays an image on its display screen based on a control signal received from the controller unit 124. The display device displays, for example, a two-dimensional (2D) slice image or a three-dimensional (3D) image of the object 115 being imaged produced by the data processing unit 125.

The operating console unit 126 can communicate with the controller unit 124 via a link 131. The operator may operate the operating console unit 126 to input data of an imaging protocol, etc. to the controller unit 124.

The data processing unit 125 comprises a computer, and a recording medium recorded with programs for the computer to perform predefined data processing. The data processing unit 125 is connected to the controller unit 124, and performs data processing based on a control signal received from the controller unit 124. The data processing unit 125 produces an MR image based on a digital signal generated at the data acquisition unit 123.

The MRI apparatus is thus configured as described above.

Recently, a large number of imaging methods capable of providing MR images effective for patient diagnosis have been developed, and various MR images beneficial to patient diagnosis can be acquired by scanning the patient with different imaging methods. Therefore, a scan of a patient with different imaging methods is adopted in performing an examination on a patient. For example, in examining a head of a patient, imaging for acquiring MR images of multiple kinds including a FLAIR image, a T1-weighted image, etc. is often performed. An attempt to acquire MR images of multiple kinds in a single examination session, however, poses a problem that the scan time is lengthened. Accordingly, to address the problem, when acquiring MR images of multiple kinds in a single examination session, the MRI apparatus in the present embodiment performs a scan to achieve as short an examination time as possible. Now a scan performed in the present embodiment will be described hereinbelow with reference to an example in which a FLAIR image and a T1-weighted image are acquired. In the following description, to clarify the effects of the present embodiment, an example of acquiring a FLAIR image and a T1-weighted image with a conventional method will be first described, and then, an example of acquiring the FLAIR image and T1-weighted image with the technique of the present embodiment will be described.

Figure 2:
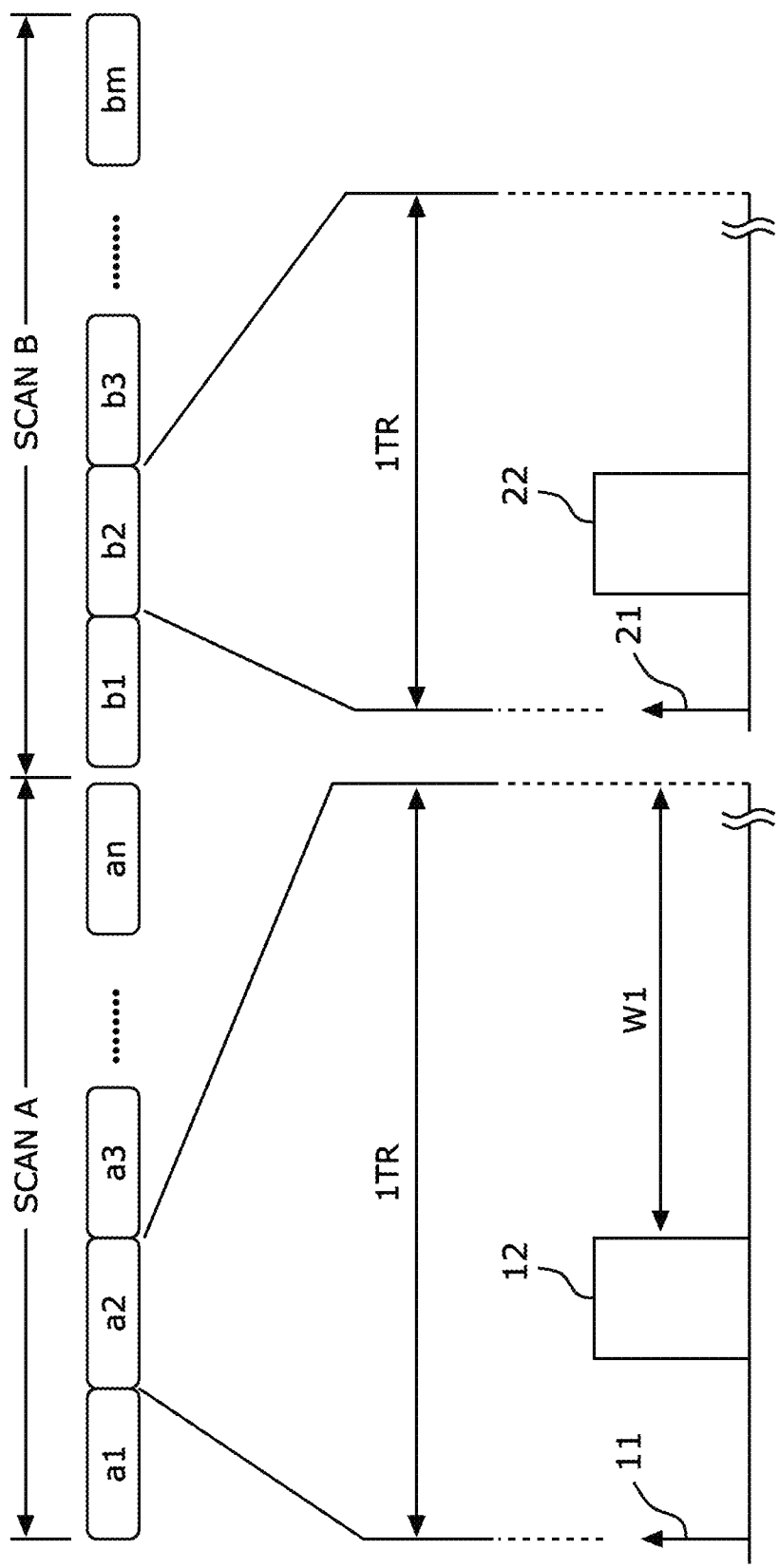
FIG. 2 is an explanatory chart for an example of acquiring a FLAIR image and a T1-weighted image by a conventional method.

FIG. 2 is an explanatory chart for the example of acquiring a FLAIR image and a T1-weighted image by a conventional method.

Referring to FIG. 2, a scan A and a scan B are shown. The scan A is for acquiring a FLAIR image, while the scan B is for acquiring a T1-weighted image.

The scan A may be divided into n segments a1 to an. The duration of each of the segments a1 to an is 1TR (Repetition Time). Therefore, the scan time of the scan A is n*TR. The scan B may be divided into m segments b1 to bm. The duration of each of the segments b1 to bm is 1TR. Therefore, the scan time of the scan B is m*TR. Note that the number n of the segments in the scan A and the number m of the segments in the scan B may be n=m or n≠m.

First, the scan A will be described. In each of the segments a1 to an, an imaging sequence for acquiring a FLAIR image is executed. FIG. 2 shows an imaging sequence executed in one segment with reference to a segment a2 among the segments a1 to an. Each segment includes an inversion pulse 11, and a 3D FSE (Fast Spin Echo) sequence 12 for generating fast spin echoes used in reconstruction of a FLAIR image.

On the other hand, in the scan B, an imaging sequence for acquiring a T1-weighted image is executed in each of the segments b1 to bm. FIG. 2 shows an imaging sequence executed in one segment with reference to a segment b2 among the segments b1 to bm. Each segment includes an inversion pulse 21, and a 3D GRE (GRadient Echo) sequence 22 for generating gradient echoes used in reconstruction of a T1-weighted image.

By thus executing the scans A and B as described above, a FLAIR image and a T1-weighted image can be acquired.

The scan A, however, needs to have a longer TR so as to be unaffected by a T1 value as much as possible. Therefore, in a duration of 1TR, a period of time (wait time) w1 from the completion of the 3D FSE sequence 12 to the start of next TR must be long, which results in the problem that the scan time of the scan A is lengthened. Moreover, since the scans A and B should be performed to acquire a FLAIR image and a T1-weighted image, the attempt to acquire MR images of multiple kinds poses another problem that the examination time is lengthened.

Figure 3:
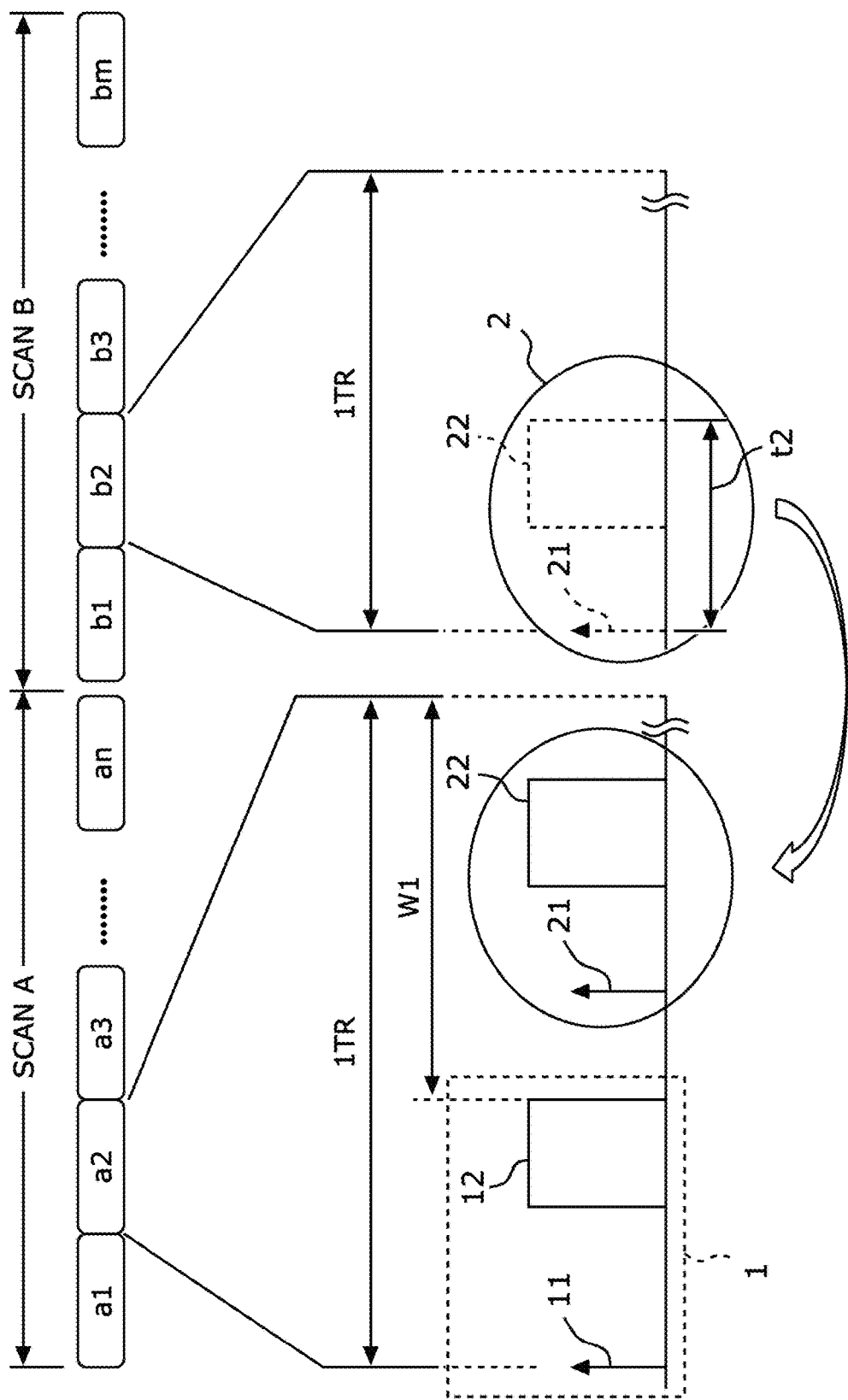
FIG. 3 is an explanatory chart for a concept of reducing an examination time taking advantage of a long wait time w1 in a scan A for a FLAIR image.

To address these problems, the inventor of the present application conceived an idea of reducing the examination time taking advantage of the fact that the wait time w1 is long in the scan A for a FLAIR image. FIG. 3 is an explanatory chart for a concept of reducing the examination time using the long wait time w1 in the scan A for a FLAIR image.

1TR in the scan A sometimes has a value of 8 sec. or more, for example. Therefore, the inventor of the present application focused on the fact that the wait time w1 in the imaging sequence 1 in the scan A for a FLAIR image is long, and came up with the idea that the wait time w1 in the imaging sequence 1 is taken advantage of as an execution time t2 of the imaging sequence 2 (inversion pulse 21 and 3D GRE sequence 22) in the scan B for a T1-weighted image. Since the execution time t2 of the imaging sequence 2 for acquiring a T1-weighted image is of the order of 3 sec., for example, it is possible to incorporate the imaging sequence 2 for acquiring a T1-weighted image into the wait time w1 in the sequence 1 for a FLAIR image. This makes it possible to reduce the examination time of an examination in which MR images of multiple kinds are acquired. An example of a scan performed based on such an idea in the present embodiment will be described hereinbelow (see FIG. 4).

Figure 4:
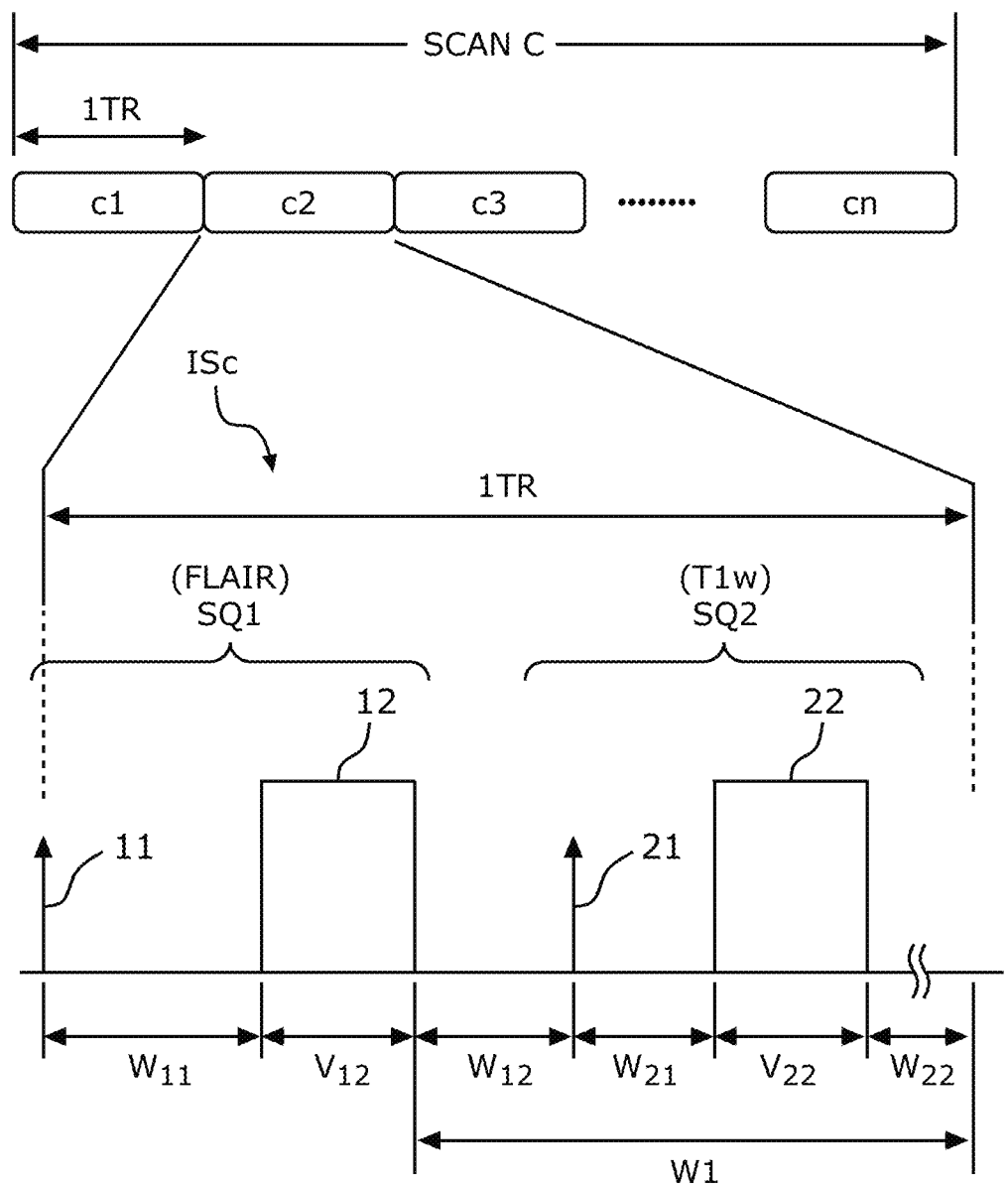
FIG. 4 is a chart showing an example of a scan performed in the present embodiment.

FIG. 4 is a chart showing an example of a scan performed in the present embodiment.

According the present embodiment, a scan C is performed. In the scan C, an imaging sequence for generating echoes from the body part being imaged is repetitively executed.

The scan C is represented by n segments ci (i=1 to n), i.e., segments c1 to cn. In each segment, an imaging sequence for generating echoes from the body part being imaged is executed. Therefore, in the scan C, the number of repetitions of the imaging sequence for generating echoes from the body part being imaged is n. The duration of each of the segments c1 to cn is 1TR. Therefore, the duration of the scan C is n*TR.

Next, an imaging sequence executed in the segments c1 to cn will be described.

Referring to FIG. 4, imaging sequences executed in the segments c1 to cn are represented by an imaging sequence ISc, which is executed in a segment i=2, i.e., segment c2.

The imaging sequence ISc includes a sequence part SQ1 for acquiring a FLAIR image, and a sequence part SQ2 for acquiring a T1-weighted image.

The sequence part SQ1 includes an inversion pulse 11 and a 3D FSE sequence 12. The inversion pulse 11 and 3D FSE sequence 12 in the sequence part SQ1 may be, for example, identical to those in the scan A shown in FIG. 2.

The inversion pulse 11 is for inverting longitudinal magnetization of tissues in the body part being imaged. The 3D FSE sequence 12 is executed at a time point after a wait time w11 has passed from the inversion pulse 11, and is a 3D sequence for generating spin echoes from the body part being imaged, for producing a FLAIR image. An execution time v12 of the 3D FSE sequence 12 may be set to a value of the order of 1 sec., for example. While the inversion pulse 11 can typically be a non-selective inversion pulse, it may be a selective inversion pulse insofar as a FLAIR image can be acquired with image quality suitable for diagnosis.

The sequence part SQ2 is executed at a time point after a wait time w12 has passed from the sequence part SQ1. The sequence part SQ2 includes an inversion pulse 21 and a 3D GRE sequence 22. The inversion pulse 21 and 3D GRE sequence 22 in the sequence part SQ2 may be, for example, identical to those in the scan B shown in FIG. 2.

The inversion pulse 21 is for inverting longitudinal magnetization of the tissues in the body part being imaged. The 3D GRE sequence 22 is executed at a time point after a wait time w21 has passed from the inversion pulse 21, and is a 3D sequence for generating gradient echoes from the body part being imaged, for producing a T1-weighted image. An execution time v22 of the 3D GRE sequence 22 may be set to a value of the order of 1 sec., for example. While the inversion pulse 21 can typically be a non-selective inversion pulse, it may be a selective inversion pulse insofar as a T1-weighted image can be acquired with image quality suitable for diagnosis.

Figure 5:
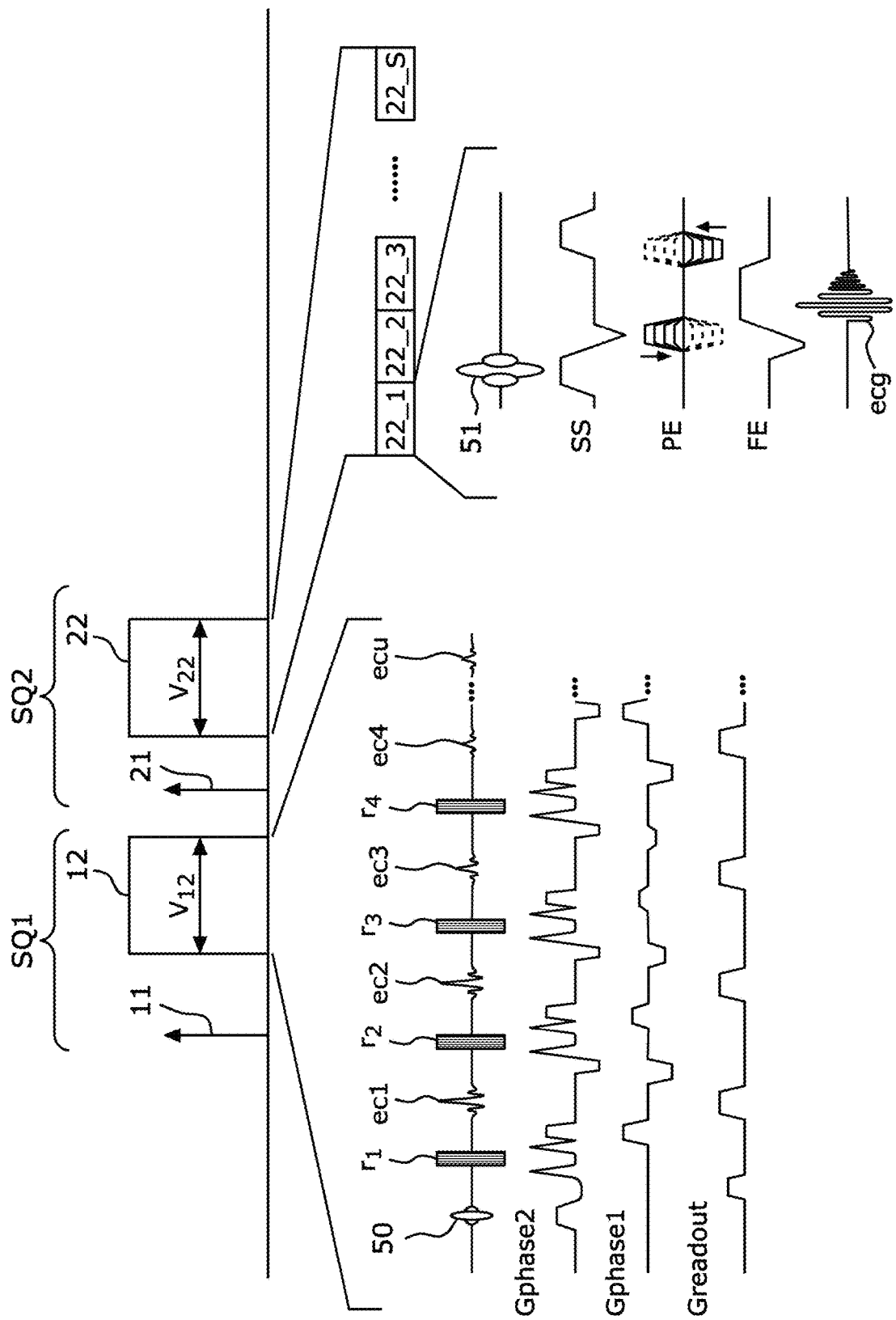
FIG. 5 is a chart showing an example of a 3D FSE sequence 12 and a 3D GRE sequence 22.

FIG. 5 is a chart showing an example of the 3D FSE sequence 12 and 3D GRE sequence 22.

Referring to FIG. 5, a 3D RARE (Rapid Acquisition with Relaxation Enhancement) sequence is shown as an example of the 3D FSE sequence 12.

The 3D FSE sequence 12 includes an excitation pulse 50, and refocusing pulses r1, r2, r3, r4, . . . . After the excitation pulse 50 is applied, the refocusing pulses r1, r2, r3, r4, . . . are applied. The excitation pulse 50 may be a 90° pulse, for example. In the sequence 12, a VFA (Variable Flip Angle) technique is employed, where the refocusing pulses r1, r2, r3, r4, . . . are applied to have a changing flip angle. Gphase 1 represents a gradient field applied in a ky-direction, and Gphase2 represents the one applied in a kz-direction. Greadout represents a readout gradient field. By applying the refocusing pulses r1, r2, r3, r4, . . . , echoes ec1, ec2, ec3, ec4, . . . can be acquired. Here, by executing the 3D FSE sequence 12, u (≥1) spin echoes ec1 to ecu can be collected. In FIG. 5, five spin echoes ec1, ec2, ec3, ec4, ecu among the u spin echoes collected by the 3D FSE sequence 12 are shown. The value of u may be u=200, for example. When u=200, the execution time v12 of the 3D FSE sequence 12 may be v12≈800 msec, for example.

The 3D GRE sequence 22 includes s sub-sequences 22_1 to 22_s. In FIG. 5, a sequence chart of the first sub-sequence 22_1 among the s sub-sequences 22_1 to 22_s is specifically shown. The sub-sequence 22_1 includes an excitation pulse 51. The excitation pulse 51 may have a flip angle smaller than 90°, for example. SS represents a gradient field applied in a slice-selection direction, PE represents the one applied in a phase-encoding direction, and FE represents the one applied in a frequency-encoding direction. By executing the sub-sequence 22_1, one gradient echo ecg can be collected. Since the 3D GRE sequence 22 here includes the s sub-sequences 22_1 to 22_s, s gradient echoes can be collected. The value of s may be s=200, for example. When s=200, the execution time v22 of the 3D GRE sequence 22 may be v22≈1200 msec, for example.

Next, a behavior of longitudinal magnetization of main tissues in the body part being imaged in executing the sequence parts SQ1 and SQ2 will be briefly described. An example of the main tissues in the body part being imaged considered here is white matter, gray matter, and a cerebrospinal fluid (abbreviated as CSF hereinbelow) in the head.

Figure 6:
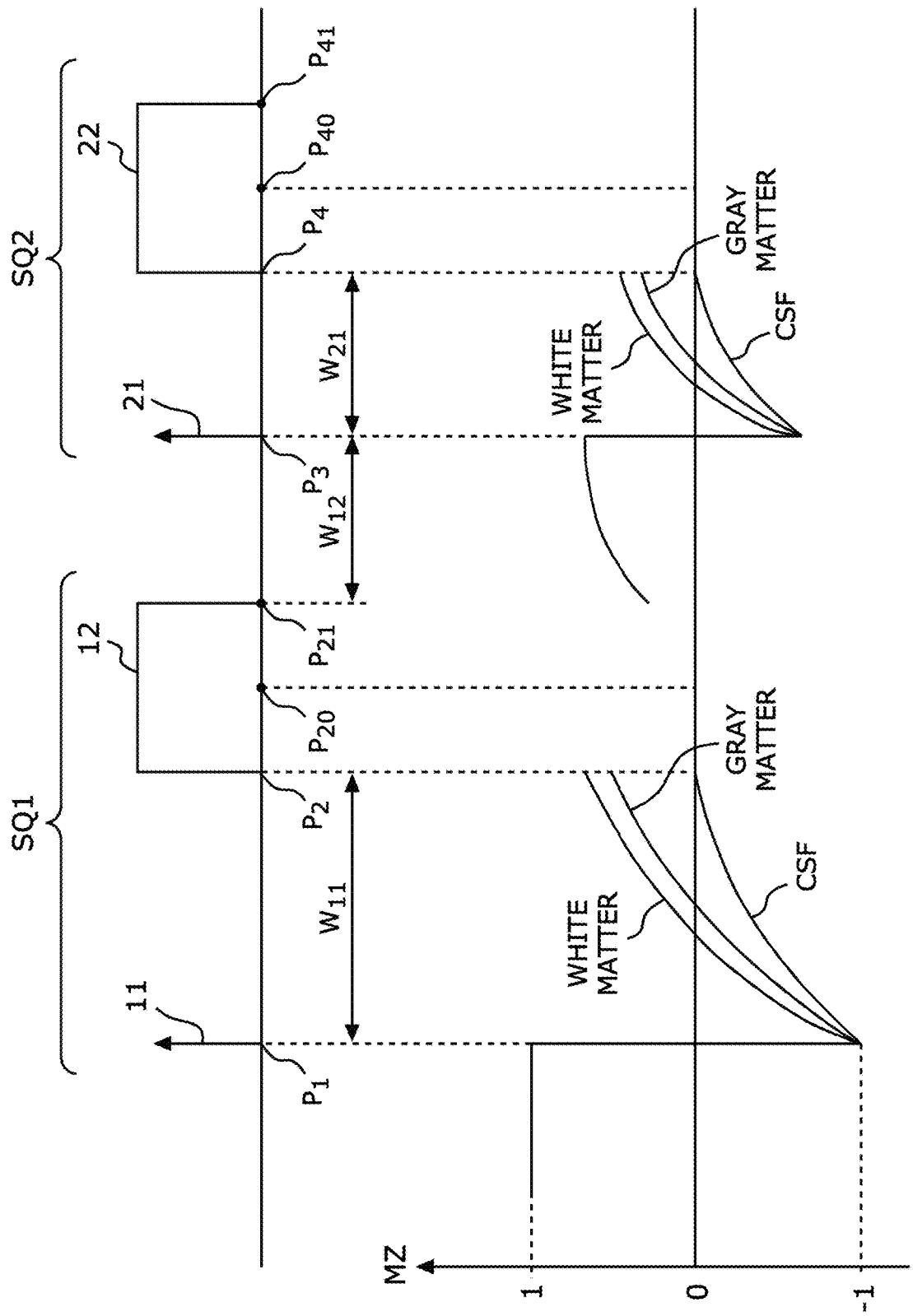
FIG. 6 is an explanatory chart for a behavior of longitudinal magnetization in white matter, gray matter, and CSF in a head.

FIG. 6 is an explanatory chart for a behavior of longitudinal magnetization in white matter, gray matter, and CSF in a head.

It is assumed that longitudinal magnetization in the tissues is Mz=1 up until immediately before a time point p1. Once the inversion pulse 11 has been applied at the time point p1, longitudinal magnetization of the body part being imaged is inverted to result in longitudinal magnetization in the tissues of Mz=−1. The tissues having inverted longitudinal magnetization undergo recovery of longitudinal magnetization according to the T1 values of the tissues. While longitudinal magnetization of white matter and gray matter recovers relatively rapidly because they have small T1 values, T1 recovery of CSF is more gradual than white matter and gray matter because CSF has a T1 value significantly greater than white matter.

Then, at a time point p2 after the wait time w11 has passed, the 3D FSE sequence 12 is executed. The wait time w11 is set to a period of time in which Mz of CSF changes from Mz=−1 to reach Mz=0 (null point) (or near Mz=0). Therefore, by executing the 3D FSE sequence 12, spin echoes for acquiring a FLAIR image can be collected. The wait time w11 may be set to a value of the order of 1.5 sec., for example. Additionally, it is possible to set the wait time w11 so that Mz of CSF reaches Mz=0 (null point) during from the start to the completion of execution of the 3D FSE sequence 12 (for example, at a time point p20 in the middle between the time point p2 of the start of execution of the 3D FSE sequence 12 and a time point p21 of the completion thereof).

After executing the 3D FSE sequence 12 at a time point p3 after the wait time w12 has passed, the sequence part SQ2 is executed.

Recovery of longitudinal magnetization of the tissues in the body part being imaged progresses during the wait time w12, and an inversion pulse 21 of the sequence part SQ2 is applied at the time point p3. Thus, longitudinal magnetization of sub-parts of the body part being imaged is inverted. The tissues having inverted longitudinal magnetization then undergo longitudinal magnetization recovery according to the T1 values of the tissues during the wait time w21. While white matter and gray matter recover relatively rapidly because they have small T1 values, T1 recovery of CSF is more gradual than white matter and gray matter because CSF has a T1 value significantly greater than white matter and gray matter.

Then, at a time point p4 after the wait time w21 has passed, the 3D GRE sequence 22 is executed. The wait times w12 and w21 are set so that longitudinal magnetization of CSF recovers up close to the null point, and moreover, T1 contrast between white matter and gray matter is as high as possible. Therefore, by executing the 3D GRE sequence 22, gradient echoes for acquiring a T1-weighted image can be collected. Both the wait times w12 and w21 can be set to a value of the order of 1 sec., for example. Additionally, it is possible to set the wait time w21 so that Mz of CSF reaches Mz=0 (null point) during from the start to the completion of execution of the 3D GRE sequence 22 (for example, at a time point p40 in the middle between the time point p4 of the start of execution of the 3D GRE sequence 22 and a time point p41 of the completion thereof).

While the segment c2 is described here, the imaging sequence ISc for generating spin echoes for a FLAIR image and gradient echoes for a T1-weighted image is also executed in other segments, as in the segment c2.

In the scan C (see FIG. 4), the sequences 12 and 22 are executed while changing magnetic field intensity of the phase-encoding gradient field in the sequences 12 and 22 on a segment-by-segment basis so that data for filling up k-space are collected. Therefore, the scan C can be performed to thereby provide a series of echoes needed for reconstruction of a FLAIR image of the body part being imaged and those for reconstruction of a T1-weighted image of the same body part being imaged.

According to the present embodiment, the sequence part SQ1 includes the inversion pulse 11 before the 3D FSE sequence 12. The sequence part SQ1 may, however, include an RF pulse with a flip angle different from 180° in place of the inversion pulse 11 insofar as the FLAIR image acquired by the sequence part SQ1 can have adequate quality suitable for diagnosis. Therefore, the inversion pulse 11 shown in FIG. 4 may be generalized into an $\alpha°$ pulse to cause the sequence part SQ1 to include the $\alpha°$ pulse and 3D FSE sequence 12. The value of $\alpha°$ can be determined with the proviso that a FLAIR image with acceptable image quality be obtained, that a scan C having as short a scan time as possible be implemented, etc., for example. Typically, $\alpha°$ may be $\alpha°=180°$. Additionally, the $\alpha°$ pulse may be a non-selective pulse or a selective pulse.

According to the present embodiment, the sequence part SQ2 includes the inversion pulse 21 before the 3D GRE sequence 22. The sequence part SQ2 may, however, include an RF pulse with a flip angle different from 180° in place of the inversion pulse 21 insofar as the T1-weighted image acquired by the sequence part SQ2 can have adequate quality suitable for diagnosis. Therefore, the inversion pulse 21 shown in FIG. 5 may be generalized into a $\beta°$ pulse to cause the sequence part SQ2 to include the $\beta°$ pulse and 3D GRE sequence 22. The value of $\beta°$ can be determined with the proviso that a T1-weighted image with acceptable image quality be obtained, that a scan C having as short a scan time as possible be implemented, etc., for example. Typically, $\beta°$ may be $\beta°=180°$. Additionally, the $\beta°$ pulse may be a non-selective pulse or a selective pulse.

The controller unit 124 (see FIG. 1) controls the RF driver unit 121 and gradient coil driver unit 122 so that the imaging sequence ISc described above is repetitively executed. To control the RF driver unit 121 and gradient coil driver unit 122, a program is stored in a storage section in the controller unit 124. The program is for causing one or more processors to generate control signals for controlling the RF driver unit 121 and gradient coil driver unit 122 so that the imaging sequence ISc described above is repetitively executed. The storage section may comprise one or more non-transitory computer-readable recording media in which one or more instructions executable by the one or more processors are stored. When executed by the processor, the one or more instructions control the RF driver unit 121 and gradient coil driver unit 122 so that the first sequence part SQ1 and second sequence part SQ2 are executed during 1TR. The first sequence part SQ1 and second sequence part SQ2 are as follows.

(1) The first sequence part SQ1 is for obtaining a FLAIR image, and includes:

(1a) an $\alpha°$ pulse applied to a body part being imaged; and (1b) a 3D FSE sequence 12 for, after the $\alpha°$ pulse has been applied to the body part being imaged, generating spin echoes for obtaining a FLAIR image from the body part being imaged.

(2) The second sequence part SQ2 is executed after the first sequence part SQ1 and is for obtaining a T1-weighted image, which includes:

(2a) a $\beta°$ pulse applied to the body part being imaged; and (2b) a gradient-echo sequence 22 for, after the $\beta°$ pulse has been applied to the body part being imaged, generating gradient echoes for obtaining a T1-weighted image from the body part being imaged. Typically, the $\alpha°$ pulse may be the inversion pulse 11 and the $\beta°$ pulse may be the inversion pulse 21.

The operation described above may be executed by one processor or by multiple processors. Moreover, while the operation described above is adapted to be executed by the processor in the controller unit 124 in the present embodiment, it may be executed by a processor separate from that in the controller unit 124.

According to the present embodiment, the 3D FSE sequence 12 is a sequence adopting a VFA method. The 3D FSE sequence 12, however, is not limited to that adopting the VFA method, and it may include a plurality of refocusing pulses, for example, with the same flip angle (for example, 180° pulses).

Moreover, the 3D FSE sequence 12 may include an FR pulse adopting an FRFSE (Fast Recovery FSE) technique. Since the FR pulse forces transverse magnetization back to longitudinal magnetization, recovery of longitudinal magnetization after the completion of the 3D FSE sequence 12 can be accelerated. Therefore, by incorporating the FR pulse into the 3D FSE sequence 12, the wait time w12 (see FIG. 4) can be shortened, thus making it possible to reduce the scan time of the scan C.

Furthermore, the number u of echoes collected by one 3D FSE sequence 12, and the number s of echoes collected by one 3D GRE sequence 22 may be set to the same value, i.e., u=s. However, the numbers u and s may be ups insofar as a FLAIR image and a T1-weighted image with adequate quality suitable for diagnosis can be acquired. It is also possible that the numbers u and s are set so that u=s for some of the segments c1 to cn, and u≠s for others of the segments.

Next, a workflow in an MR examination using the scan C in FIG. 4 will be briefly described.

Figure 7:
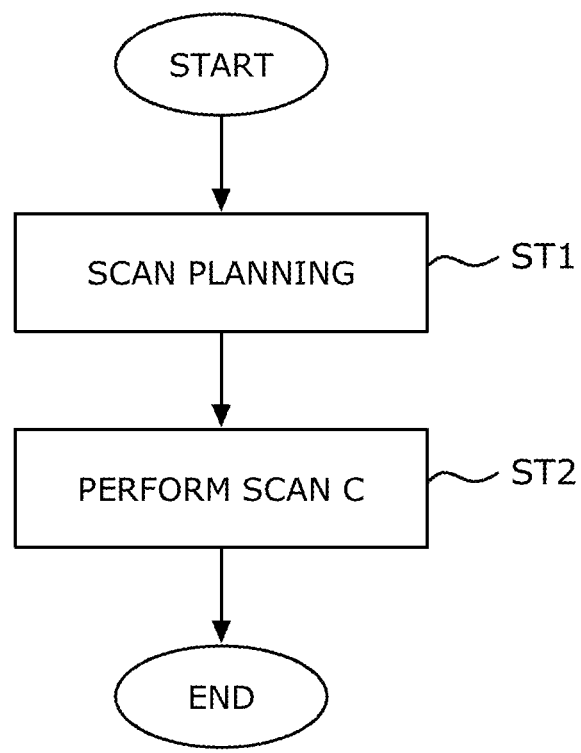
FIG. 7 is a chart showing a workflow of an MR examination.

FIG. 7 is a chart showing a workflow of an MR examination.

Figure 8:
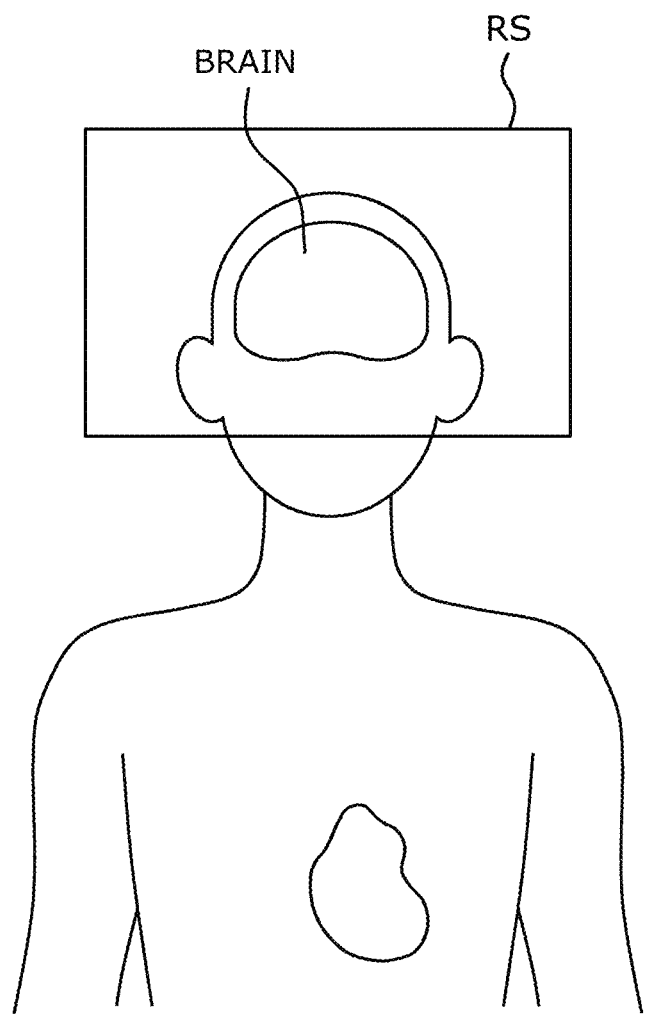
FIG. 8 is a diagram showing an example of a region to be imaged RS.

At Step ST1, an operator makes a scan plan. In the scan plan, a region to be imaged is defined. FIG. 8 is a diagram showing an example of a region to be imaged RS. It is assumed here that the body part to be imaged is a brain. Therefore, the operator defines the region to be imaged RS to include the brain. The operator also defines scan conditions for performing the scan C.

At Step ST2, the scan C is performed. Since the region to be imaged RS includes the brain, a FLAIR image and a T1-weighted image of a body part including the brain can be acquired by performing the scan C.

The flow is thus completed.

In the scan C, the sequence part SQ2 for a T1-weighted image is executed taking advantage of the wait time w1 (see FIG. 4) in the sequence part SQ1 for a FLAIR image. Since a FLAIR image and a T1-weighted image can thus be acquired by merely performing the scan C, the scan time and/or examination time can be reduced.

Moreover, the region to be imaged RS (see FIG. 8) defined by the operator at Step ST1 is a region to be imaged for a FLAIR image and at the same time for a T1-weighted image. Since this eliminates the need for the operator to separately define the region to be imaged for a FLAIR image and that for a T1-weighted image, it is possible to lighten an operator's workload as well. Additionally, while the example of imaging the brain (head) is shown in FIG. 8, the body part to be imaged is not limited to the brain (head), and the present invention may be also applied to cases in which a body part separate from the brain (head) is to be imaged.

Additionally, while the imaging sequence ISc is executed in the scan C in FIG. 4, the present invention is not limited to the imaging sequence ISc, and an imaging sequence different from the imaging sequence ISc may be executed. Now several variations in which an imaging sequence different from the imaging sequence ISc is executed will be described hereinbelow.

Figure 9:
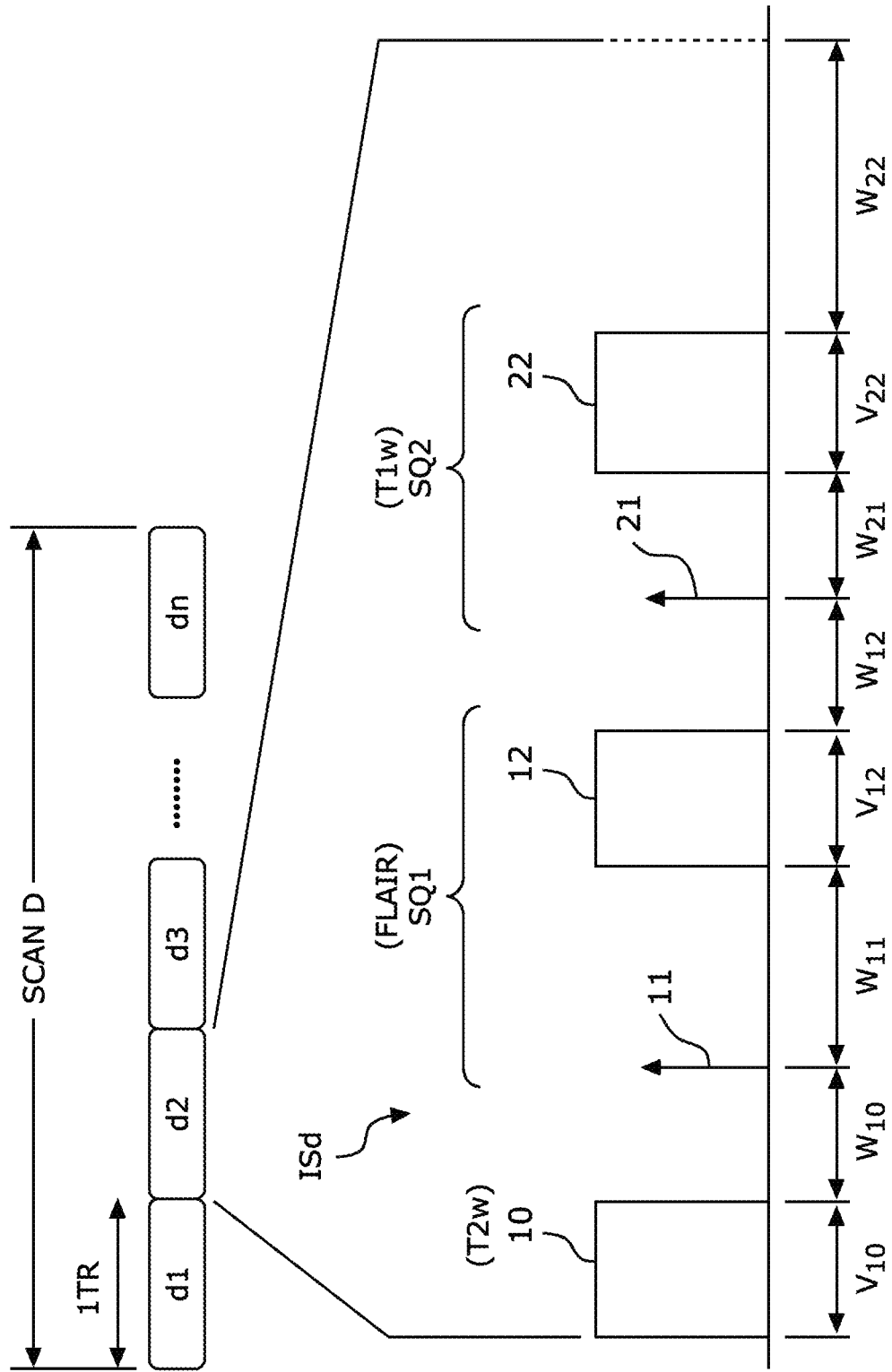
FIG. 9 is an explanatory chart for Variation 1.

FIG. 9 is an explanatory chart for Variation 1.

FIG. 9 shows a scan D. In the scan D, an imaging sequence ISd is executed. As compared with the imaging sequence ISc (see FIG. 4), the imaging sequence ISd is different therefrom in that a 3D FSE sequence 10 is added. The 3D FSE sequence 10 is prepended to the sequence part SQ1. Therefore, in the example in which the imaging sequence ISd is executed, the one or more instructions stored in the recording medium cause the processor to perform an operation of controlling the RF driver unit 121 and gradient coil driver unit 122 so that the 3D FSE sequence 10, first sequence part SQ1, and second sequence part SQ2 are executed in this order during 1TR.

The 3D FSE sequence 10 is for acquiring a T2-weighted image. Therefore, according to Variation 1, in addition to the FLAIR image and T1-weighted image, the T2-weighted image can be acquired by performing the scan D. The execution time v10 for the 3D FSE sequence 10 may be a value of the order of 1 sec., for example. A wait time w10 is put between the 3D FSE sequence 10 and sequence part SQ1. As the wait time w10 becomes longer the duration of 1TR becomes longer, and accordingly, the scan time of the scan D is lengthened. Therefore, when it is desired to avoid lengthening of the scan time, the wait time w10 is desirably reduced as much as possible. On the other hand, too short a wait time w10 causes the sequence part SQ1 to prematurely start before longitudinal magnetization of white matter, gray matter, and CSF is fully recovered, which leads to risks that intensity of signals from white matter and gray matter cannot be enhanced, CSF may exhibit signal nonuniformity, and/or signals from CSF cannot be fully suppressed. Therefore, it is desirable to set the wait time w10 taking account of both the scan time and image quality of the FLAIR image. The wait time w10 may be set to a value of the order of 1 sec., for example.

Additionally, the 3D FSE sequence 10 may include a plurality of refocusing pulses with the same flip angle (for example, 180° pulses), or may include an FR pulse.

Figure 10:
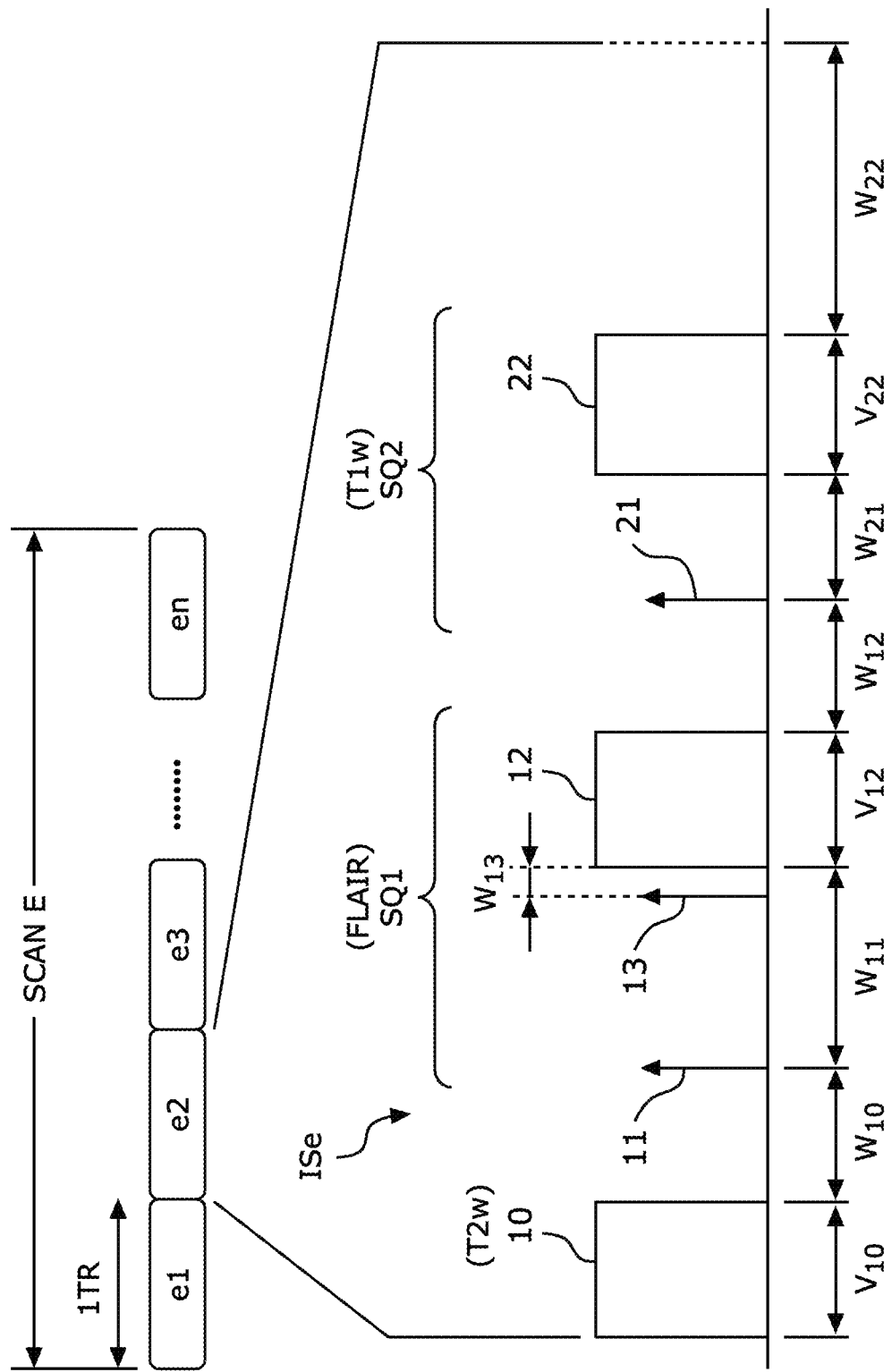
FIG. 10 is an explanatory chart for Variation 2.

FIG. 10 is an explanatory chart for Variation 2.

FIG. 10 shows a scan E. In the scan E, an imaging sequence ISe is executed. As compared with the imaging sequence ISd (see FIG. 9), the imaging sequence ISe is different therefrom in that the sequence part SQ1 includes a fat suppression pulse 13. The fat suppression pulse 13 is prepended to the 3D FSE sequence 12. Therefore, in the example in which the imaging sequence ISe is executed, the one or more instructions stored in the recording medium cause the processor to perform an operation of controlling the RF driver unit 121 and gradient coil driver unit 122 so that the 3D FSE sequence 10, first sequence part SQ1 including the fat suppression pulse 13, and second sequence part SQ2 are executed in this order during 1TR.

By the sequence part SQ1 including the fat suppression pulse 13, a FLAIR image having suppressed fat signals can be acquired.

Additionally, a wait time w13 is put between the fat suppression pulse 13 and 3D FSE sequence 12. The wait time w13 is desirably as short as possible so that the fat suppressing effect of the fat suppression pulse 13 can be fully attained. The wait time w13 may be set to a value of the order of several msec., for example.

Figure 11:
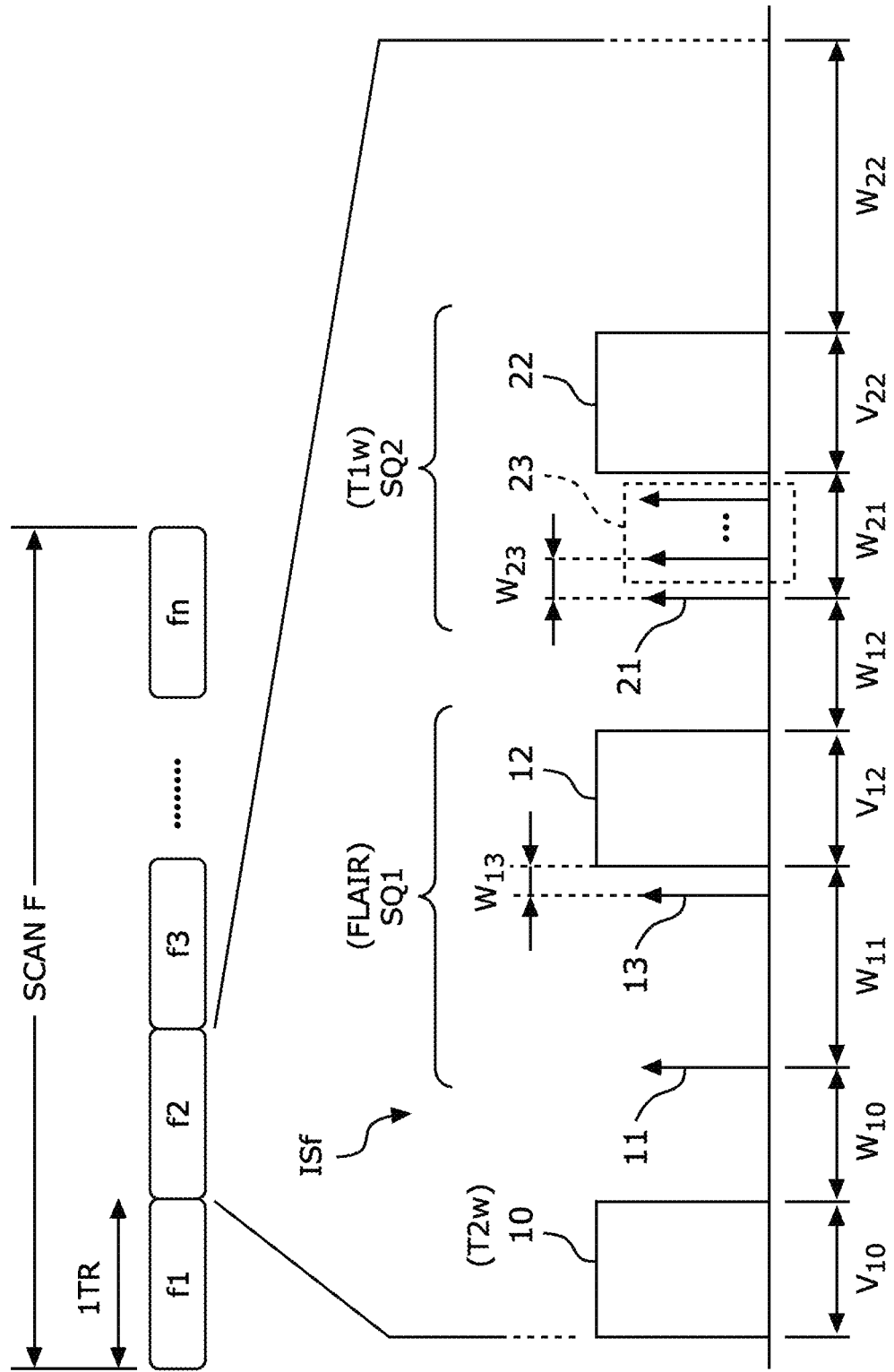
FIG. 11 is an explanatory chart for Variation 3.

FIG. 11 is an explanatory chart for Variation 3.

FIG. 11 shows a scan F. In the scan F, an imaging sequence ISf is executed. As compared with the imaging sequence ISe (see FIG. 10), the imaging sequence ISf is different therefrom in that the sequence part SQ2 includes a DANTE (Delay Alternating with Nutation for Tailored Excitation) train 23. The DANTE train 23 is added between the inversion pulse 21 and 3D GRE sequence 22. Therefore, in the example in which the imaging sequence ISf is executed, the one or more instructions stored in the recording medium cause the processor to perform an operation of controlling the RF driver unit 121 and gradient coil driver unit 122 so that the 3D FSE sequence 10, first sequence part SQ1 including the fat suppression pulse 13, and second sequence part SQ2 including the DANTE train 23 are executed in this order during 1TR.

By applying the DANTE train 23, it is possible to acquire a T1-weighted image in which blood vessel signals are further suppressed. The DANTE train 23 may include a number on the order of 100 DANTE pulses, for example. The DANTE pulse may be a non-selective pulse or a selective pulse.

A wait time w23 is put between the inversion pulse 21 and DANTE train 23. Since the blood vessel signal suppressing effect of the DANTE train 23 decreases for a longer wait time w23, the wait time w23 is desirably set to be as long as possible, taking account of the duration of the DANTE train 23, etc. The wait time w23 may be set to a value of the order of 800 msec., for example.

Figure 12:
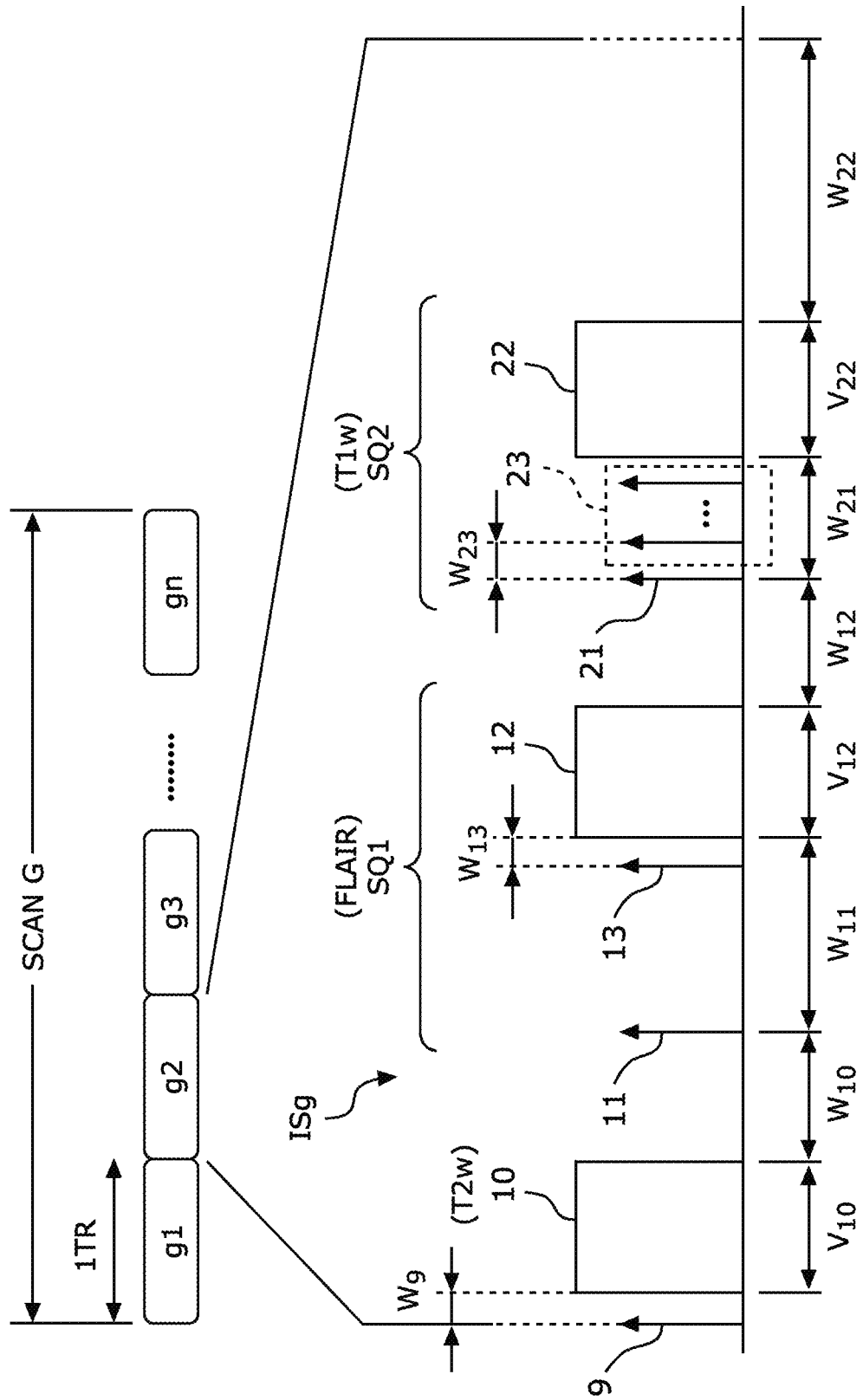
FIG. 12 is an explanatory chart for Variation 4.

FIG. 12 is an explanatory chart for Variation 4.

FIG. 12 shows a scan G. In the scan G, an imaging sequence ISg is executed. As compared with the imaging sequence ISf (see FIG. 11), the imaging sequence ISg is different therefrom in that a fat suppression pulse 9 is prepended to the 3D FSE sequence 10. Therefore, in the example of executing the imaging sequence ISg, the one or more instructions stored in the recording medium cause the processor to perform an operation of controlling the RF driver unit 121 and gradient coil driver unit 122 so that the fat suppression pulse 9, 3D FSE sequence 10, first sequence part SQ1 including the fat suppression pulse 13, and second sequence part SQ2 including the DANTE train 23 are executed in this order during 1TR.

By applying the fat suppression pulse 9, a T2-weighted image having suppressed fat signals can be acquired.

Additionally, a wait time w9 is put between the fat suppression pulse 9 and 3D FSE sequence 10. The wait time w9 is desirably as short as possible so that the fat suppressing effect of the fat suppression pulse 9 can be fully attained. The wait time w9 may be set to a value of the order of several msec., for example.

Figure 13:
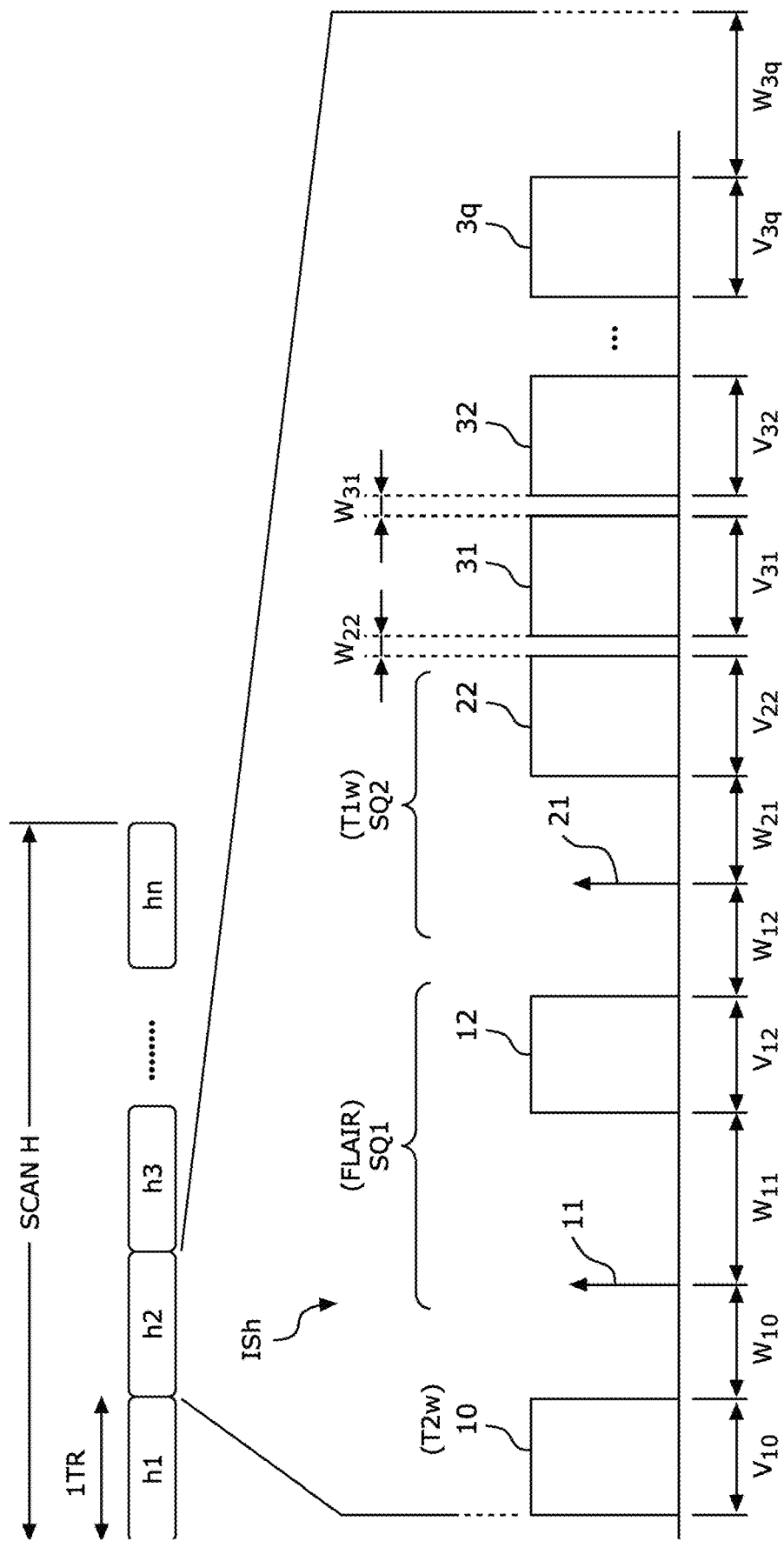
FIG. 13 is an explanatory chart for Variation 5.

FIG. 13 is an explanatory chart for Variation 5.

FIG. 13 shows a scan H. In the scan H, an imaging sequence ISh is executed. As compared with the imaging sequence ISd (see FIG. 9), the imaging sequence ISh is different therefrom in that q (≥1) 3D GRE sequences 31, 32, ..., 3q are added after the sequence part SQ2. Therefore, in the example of executing the imaging sequence ISh, the one or more instructions stored in the recording medium cause the processor to perform an operation of controlling the RF driver unit 121 and gradient coil driver unit 122 so that the 3D FSE sequence 10, first sequence part SQ1, second sequence part SQ2, and q 3D GRE sequences 31 to 3q are executed in this order during 1TR.

By adding the q 3D GRE sequences 31, 32, ..., 3q, the 3D GRE sequence 22, and in addition, the q 3D GRE sequences 31, 32, ..., 3q can be executed during 1TR. Since a plurality of 3D GRE sequences are thus executed during 1TR at different times, it is possible to acquire MR images (for example, T2* image) and/or a mapping image, aside from the T1-weighted image. Moreover, it is possible for the data processing unit 125 (see FIG. 1) to obtain various calculation images by using known calculation techniques for an MR image based on a dataset of at least part of the whole data collected by the 3D GRE sequence 22 and 3D GRE sequences 31, 32, ..., 3q.

Furthermore, while the imaging sequence ISh in FIG. 13 includes no fat suppression pulse, it may include a fat suppression pulse, as needed, as shown in FIGS. 10 to 12.

In the imaging sequences ISc to ISh in the preceding description, the FSE sequence 12 is used to acquire a FLAIR image, while the FSE sequence 10 is used to acquire a T2-weighted image. It is, however, possible to use an SE sequence, in place of the FSE sequence, for collecting a single echo.

Moreover, while the FSE sequence 10, FSE sequence 12, GRE sequence 22, and GRE sequences 31 to 3q described above are 3D sequences, it is possible to apply the present invention to a case in which these sequences 10, 12, 22, and 31 to 3q are 2D sequences.

Next, images actually acquired by the technique of the present embodiment will be described.

FIG. 14 is a diagram showing an example of images actually acquired by the technique of the present embodiment.

The images shown in the upper row of FIG. 14 are a T2-weighted image, a FLAIR image, and a T1-weighted image actually acquired by the technique of the present embodiment. The T2-weighted image, FLAIR image, and T1-weighted image were acquired by the scan E shown in FIG. 10. The scan time was 3 min.

In the lower row of FIG. 14 are shown a T2-weighted image, a FLAIR image, and a T1-weighted image acquired by separate scans as a comparative example. The number of data samples and image spatial resolution in the comparative example are the same as those in the technique of the present embodiment. In the comparative example, the scan time for the T2-weighted image was 1 min. 40 sec., that for the FLAIR image was 2 min. 47 sec., and that for the T1-weighted image was 1 min. 56 sec. Therefore, in the comparative example, the scan time needed to acquire these images was 6 min. 23 sec. in total.

Comparing the T2-weighted image, FLAIR image, and T1-weighted image acquired by the technique of the present embodiment with those in the comparative example, the former have image quality comparable with that of the latter. Therefore, it can be seen that by using the technique of the present embodiment, images of image quality equivalent to those in the comparative example can be obtained in half the scan time in the comparative example.

Embodiments of the present disclosure shown in the drawings and described above are example embodiments only and are not intended to limit the scope of the appended claims, including any equivalents as included within the scope of the claims. Various modifications are possible and will be readily apparent to the skilled person in the art. It is intended that any combination of non-mutually exclusive features described herein are within the scope of the present invention. That is, features of the described embodiments can be combined with any appropriate aspect described above and optional features of any one aspect can be combined with any other appropriate aspect. Similarly, features set forth in dependent claims can be combined with non-mutually exclusive features of other dependent claims, particularly where the dependent claims depend on the same independent claim. Single claim dependencies may have been used as practice in some jurisdictions require them, but this should not be taken to mean that the features in the dependent claims are mutually exclusive.

The invention claimed is:

1. A magnetic resonance imaging apparatus comprising:
a first driver unit for driving an RF coil unit;
a second driver unit for driving a gradient coil unit; and
a controller unit for controlling said first driver unit and said second driver unit so that an imaging sequence having a duration of 1TR and being for generating echoes from a body part being imaged is repetitively executed, wherein
said imaging sequence has a first sequence part for obtaining a FLAIR image, and a second sequence part executed after said first sequence part and being for obtaining a T1-weighted image, said first sequence part including:
(1a) an $\alpha°$ pulse applied to said body part being imaged; and
(1b) a spin-echo sequence for, after said $\alpha°$ pulse has been applied to said body part being imaged, generating spin echoes for obtaining a FLAIR image from said body part being imaged, and said second sequence part including:
(2a) a $\beta°$ pulse applied to said body part being imaged; and
(2b) a gradient-echo sequence for, after said $\beta°$ pulse has been applied to said body part being imaged, generating gradient echoes for obtaining a T1-weighted image from said body part being imaged.

2. The magnetic resonance imaging apparatus as recited in claim 1, wherein:
said imaging sequence includes another spin-echo sequence executed before the first sequence part and being for generating spin echoes for obtaining a T2-weighted image from said body part being imaged.

3. The magnetic resonance imaging apparatus as recited in claim 1, wherein: said first sequence part includes a fat suppression pulse between said $\alpha°$ pulse and said spin-echo sequence.

4. The magnetic resonance imaging apparatus as recited in claim 1, wherein: said second sequence part includes a DANTE train between said $\beta°$ pulse and said gradient-echo sequence.

5. The magnetic resonance imaging apparatus as recited in claim 2, wherein:
  said imaging sequence includes a fat suppression pulse before said other spin-echo sequence.

6. The magnetic resonance imaging apparatus as recited in claim 1, wherein:
  said imaging sequence includes q gradient-echo sequences executed after said second sequence part.

7. The magnetic resonance imaging apparatus as recited in claim 6, having: a data processing unit for obtaining a calculation image based on a dataset of at least part of whole data collected by said gradient-echo sequence and said q gradient-echo sequences.

8. The magnetic resonance imaging apparatus as recited in claim 1, wherein: said spin-echo sequence is a fast spin-echo sequence.

9. The magnetic resonance imaging apparatus as recited in claim 8, wherein:
  said fast spin-echo sequence has a plurality of refocusing pulses, and
  said plurality of refocusing pulses are applied to have a changing flip angle.

10. The magnetic resonance imaging apparatus as recited in claim 1, wherein: the number of echoes collected by said spin-echo sequence and that collected by said gradient-echo sequence are equal.

11. The magnetic resonance imaging apparatus as recited in claim 1, wherein: said $\alpha°$ pulse or said $\beta°$ pulse is a non-selective pulse.

12. The magnetic resonance imaging apparatus as recited in claim 1, wherein: said $\alpha°$ pulse or said $\beta°$ pulse is an inversion pulse.

13. The magnetic resonance imaging apparatus as recited in claim 1, wherein: said spin-echo sequence includes an FR pulse.

14. The magnetic resonance imaging apparatus as recited in claim 5, wherein: said other spin-echo sequence includes an FR pulse.

15. A program for causing one or more processors to generate control signals for controlling a first driver unit for driving an RF coil unit and a second driver unit for driving a gradient coil unit so that a first sequence part for obtaining a FLAIR image, and a second sequence part executed after said first sequence part has been executed and being for obtaining a T1-weighted image are executed during 1TR, said first sequence part including:
  (1a) an $\alpha°$ pulse applied to a body part being imaged; and
  (1b) a spin-echo sequence for, after said $\alpha°$ pulse has been applied to said body part being imaged, generating spin echoes for obtaining a FLAIR image from said body part being imaged, and said second sequence part including:
  (2a) a $\beta°$ pulse applied to said body part being imaged; and
  (2b) a gradient-echo sequence for, after said $\beta°$ pulse has been applied to said body part being imaged, generating gradient echoes for obtaining a T1-weighted image from said body part being imaged.

* * * * *